United States Patent
Moon et al.

(10) Patent No.: US 9,577,166 B2
(45) Date of Patent: Feb. 21, 2017

(54) LIGHT EMITTING DEVICE PACKAGE AND LIGHTING SYSTEM INCLUDING THE SAME

(71) Applicant: LG INNOTEK CO., LTD., Seoul (KR)

(72) Inventors: Yon Tae Moon, Seoul (KR); Yun Soo Song, Seoul (KR); Kwang Kyu Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 95 days.

(21) Appl. No.: 14/840,709

(22) Filed: Aug. 31, 2015

(65) Prior Publication Data

US 2015/0372206 A1   Dec. 24, 2015

Related U.S. Application Data

(63) Continuation of application No. 14/464,391, filed on Aug. 20, 2014, now Pat. No. 9,159,891, which is a continuation of application No. 13/623,210, filed on Sep. 20, 2012, now Pat. No. 8,841,687.

(30) Foreign Application Priority Data

Sep. 20, 2011 (KR) .................. 10-2011-0094802

(51) Int. Cl.
| | |
|---|---|
| *H01L 33/00* | (2010.01) |
| *H01L 33/60* | (2010.01) |
| *H01L 33/50* | (2010.01) |
| *H01L 33/38* | (2010.01) |
| *H01L 33/48* | (2010.01) |
| *H01L 33/54* | (2010.01) |
| *F21V 7/05* | (2006.01) |
| *F21Y 101/00* | (2016.01) |

(52) U.S. Cl.
CPC .............. *H01L 33/60* (2013.01); *H01L 33/38* (2013.01); *H01L 33/483* (2013.01); *H01L 33/50* (2013.01); *F21K 9/23* (2016.08); *F21V 7/05* (2013.01); *F21Y 2101/00* (2013.01); *F21Y 2105/10* (2016.08); *F21Y 2113/13* (2016.08); *F21Y 2115/10* (2016.08); *H01L 33/486* (2013.01); *H01L 33/54* (2013.01); *H01L 2924/0002* (2013.01)

(58) Field of Classification Search
CPC ........ H01L 33/483; H01L 33/60; H01L 33/38; H01L 33/50; H01L 33/486; H01L 2924/0002; H01L 33/54; H01L 2924/00; F21V 7/05; F21Y 2101/00
USPC ... 257/98, 99.1, 95, E33.06; 438/22, 25, 26, 438/27
See application file for complete search history.

(56) References Cited

U.S. PATENT DOCUMENTS 6,733,711 B2   5/2004   Durocher et al.
6,746,295 B2   6/2004   Sorg
(Continued)

OTHER PUBLICATIONS

U.S. Office Action for parent U.S. Appl. No. 14/464,391 dated Feb. 9, 2015.

*Primary Examiner* — Thinh T Nguyen
(74) *Attorney, Agent, or Firm* — KED & Associates LLP (57) ABSTRACT

Provided are a light emitting device package and a lighting system including the light emitting device package. The light emitting device package includes a package body, at least one electrode on the package body, a light emitting device on the package body, a reflective structure around the light emitting device on the package body and a lens on the light emitting device and the electrode.

20 Claims, 8 Drawing Sheets

(56) References Cited

U.S. PATENT DOCUMENTS

| | | | |
|---|---|---|---|
| 6,774,401 B2 * | 8/2004 | Nakada | H01L 33/405 |
| | | | 257/81 |
| 6,860,621 B2 | 3/2005 | Bachl et al. | |
| 6,995,402 B2 | 2/2006 | Ludowise et al. | |
| 7,244,965 B2 * | 7/2007 | Andrews | H01L 33/486 |
| | | | 257/100 |
| 8,188,488 B2 | 5/2012 | Andrews et al. | |
| 8,735,920 B2 * | 5/2014 | Ibbetson | H01L 33/486 |
| | | | 257/100 |
| 2003/0142500 A1 | 7/2003 | Bachl et al. | |
| 2003/0153108 A1 | 8/2003 | Durocher et al. | |
| 2004/0079957 A1 * | 4/2004 | Andrews | H01L 33/486 |
| | | | 257/100 |
| 2005/0179376 A1 * | 8/2005 | Fung | H01L 33/58 |
| | | | 313/512 |
| 2006/0086940 A1 | 4/2006 | Wang et al. | |
| 2008/0023711 A1 * | 1/2008 | Tarsa | H01L 33/486 |
| | | | 257/98 |
| 2009/0016066 A1 | 1/2009 | Chen | |
| 2010/0044735 A1 * | 2/2010 | Oyamada | H01L 33/504 |
| | | | 257/98 |
| 2011/0266569 A1 * | 11/2011 | Basin | H01L 33/0079 |
| | | | 257/98 |

\* cited by examiner

LIGHT EMITTING DEVICE PACKAGE AND LIGHTING SYSTEM INCLUDING THE SAME

CROSS-REFERENCE TO RELATED APPLICATIONS

This application is a Continuation Application of prior U.S. patent application Ser. No. 14/464,391 (filed Aug. 20, 2014), which is a Continuation Application of prior co-pending U.S. patent application Ser. No. 13/623,210 (filed Sep. 20, 2012) (now U.S. Pat. No. 8,841,687), which claims priority under 35 U.S.C. §119 to Korean Patent Application No. 10-2011-0094802 (filed on Sep. 20, 2011), which is hereby incorporated by reference in its entirety.

BACKGROUND

Embodiments relate to a light emitting device package and a lighting system including the light emitting device package.

Light emitting devices (LEDs), which are semiconductor devices for converting electrical energy into light energy, may emit light of various wavelengths (colors), such as red, green, blue, and ultraviolet rays, by controlling a composition of a semiconductor compound, and generate white light having high efficiency, by using a phosphor or combining colors.

Light emitting devices are superior to typical light sources such as fluorescent lamps and incandescent lamps in power consumption, service life, response speed, safety, and environmental friendliness. Accordingly, light emitting devices are widely used in light emitting diode backlights that replace cold cathode fluorescence lamps (CCFLs) constituting backlights of liquid crystal display (LCD) devices; white light emitting diode lighting devices that replace fluorescent lamps and incandescent lamps; vehicle headlamps; and traffic lights.

Typical light emitting device packages include a light emitting device mounted on a package body and an electrode layer disposed on the package body and electrically connected to the light emitting device. A resin layer including a phosphor is formed on the light emitting device, and a molding part having a certain lens shape is disposed on the resin layer.

When such a light emitting device package has a two dimensional structure in which a package body for mounting a light emitting device has no cavity, it may be difficult to control a vertical light emission distribution, which degrades light extraction efficiency.

SUMMARY

Embodiments provide a light emitting device package having improved light extraction efficiency, and a lighting system including the light emitting device package.

In one embodiment, a light emitting device package includes: a package body; at least one electrode on the package body; a light emitting device on the package body; a reflective structure around the light emitting device on the package body; and a lens on the light emitting device and the electrode.

Also, in another embodiment, a light emitting device package includes: a package body; at least one electrode on the package body; a light emitting device on the package body; a reflective structure surrounding the light emitting device on the package body; a resin on the light emitting device; and a lens on the resin, wherein the resin is disposed in an inside area of the reflective structure.

In another embodiment, a lighting system includes a light emitting module part including the light emitting device package.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

In the description of embodiments, it will be understood that when a layer (or film) is referred to as being 'on/over' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

EMBODIMENTS

Figure 1:
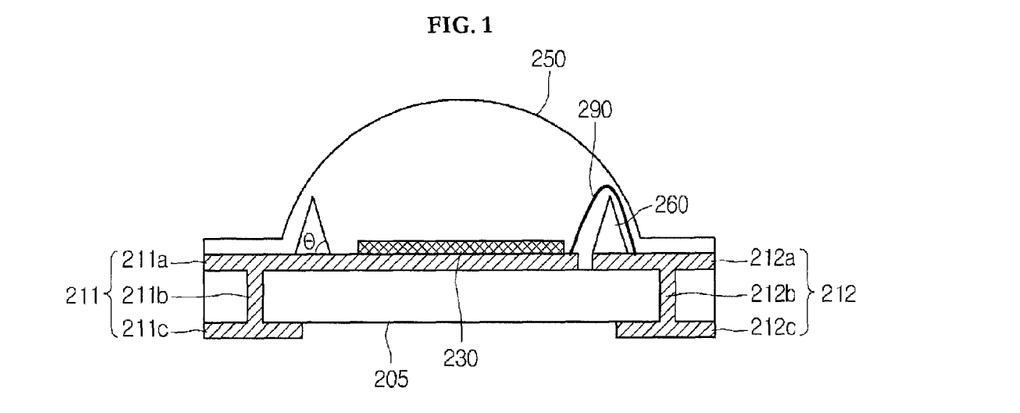
FIG. 1 is a cross-sectional view illustrating a light emitting device package according to a first embodiment.

FIG. 1 is a cross-sectional view illustrating a light emitting device package according to a first embodiment.

The light emitting device package may include: a package body 205; a light emitting device 230 on the package body 205; electrodes 211 and 212, which are disposed on the package body 205, and are electrically connected to the light emitting device 230; a lens 250 on the light emitting device 230 and a reflective structure 260 around the light emitting device 230 on the package body 205.

The package body 205 may include a ceramic dielectric layer, but is not limited thereto. For example, a ceramic insulation layer constituting the package body 205 may be formed of a nitride or oxide. For example, the package body 205 may comprise at least one of $SiO_2$, $Si_xO_y$, $Si_3N_4$, $Si_xN_y$, $SiO_xN_y$, $Al_2O_3$, or AlN, but is not limited thereto.

The light emitting device package may have improved vertical light extraction efficiency, and constitutes a lighting system according to the current embodiment.

To this end, the reflective structure 260 disposed around the light emitting device 230 on the package body 205 may control a vertical light emission distribution.

The reflective structure 260 may be disposed between the lens 250 and the electrodes 211 and 212. For example, the reflective structure 260 may be disposed on the electrodes 211 and 212 under the periphery of the lens 250, but is not limited thereto.

The lens 250 may be different in an index of refraction from the reflective structure 260 that may be disposed within the lens 250.

The lens 250 can cover the reflective structure. For example, the lens 250 can cover an outside surface of the reflective structure 260, and the reflective structure 260 can be surrounded by the lens 250. And, the reflective structure 260 cannot be exposed through the lens 250.

Also, the lens 250 can be directly disposed on the reflective structure 260.

The reflective structure 260 may have a side surface having an angle of inclination smaller than 90° from a horizontal line. For example, the angle of inclination of the side surface of the reflective structure 260 may range from about 45° to about 90°, but is not limited thereto.

The reflective structure 260 may surround the light emitting device 230. For example, the reflective structure 260 may be provided in the form of a dam or ring to surround the light emitting device 230, but is not limited thereto.

The light emitting device 230 may be disposed in the reflective structure 260.

The reflective structure 260 may have a height greater than that of the light emitting device 230.

For example, a top surface of the reflective structure 260 may be higher than a top surface of the light emitting device 230, so that light emitted from the light emitting device 230 can be reflected upwardly at an orientation angle of about 120°, thereby controlling a vertical light emission distribution.

The reflective structure 260 may be formed of an insulating material having reflectivity. For example, the reflective structure 260 may include an oxide film comprising at least one of $TiO_2$ or $SiO_2$, but is not limited thereto. The reflective structure 260 may be formed using a mold, but is not limited thereto.

Figure 2:
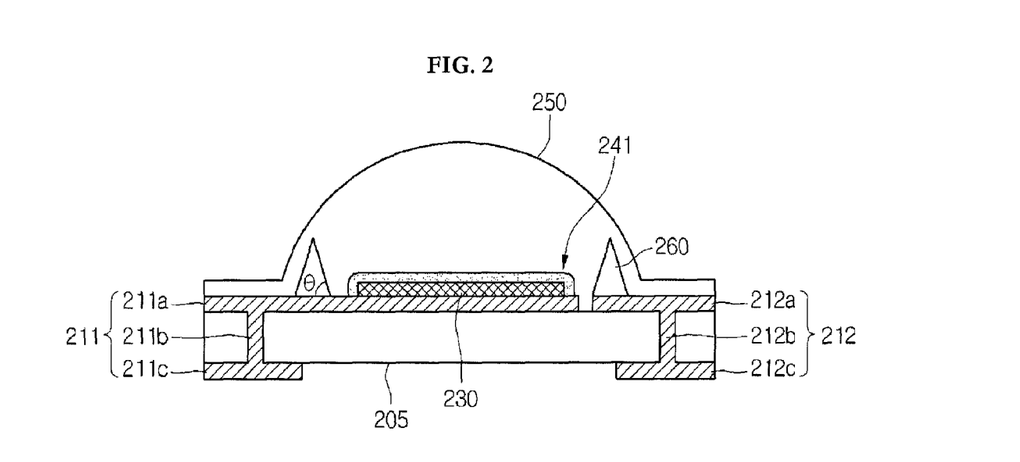
FIG. 2 is a cross-sectional view illustrating a light emitting device package according to a second embodiment.

FIG. 2 is a cross-sectional view illustrating a light emitting device package according to a second embodiment. According to the second embodiment, a phosphor layer 241 may be disposed on the light emitting device 230.

Figure 3:
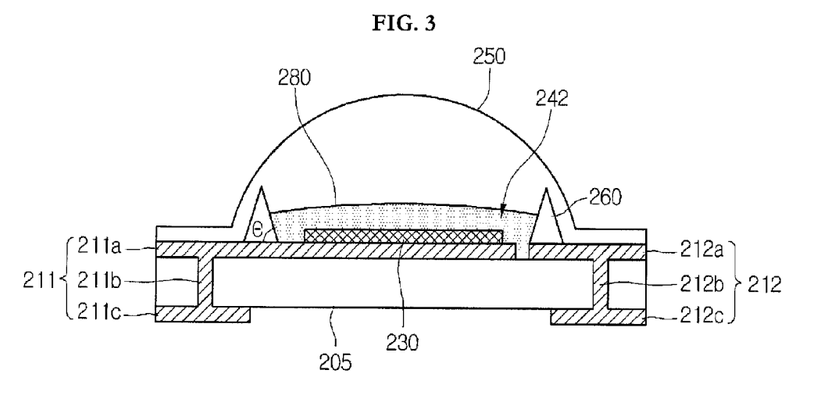
FIG. 3 is a cross-sectional view illustrating a light emitting device package according to a third embodiment.

FIG. 3 is a cross-sectional view illustrating a light emitting device package according to a third embodiment.

According to the third embodiment, a resin 280 can be disposed on the light emitting device 230. For example, the resin layer 280 may have a dome shape through a dotting process.

Figure 4:
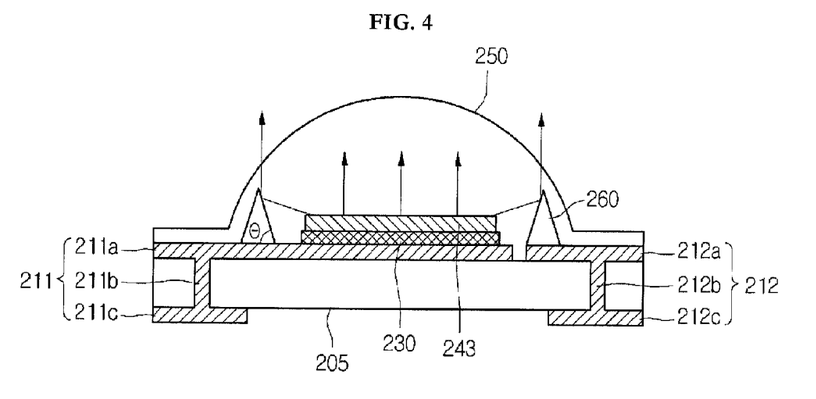
FIG. 4 is a cross-sectional view illustrating a light emitting device package according to a fourth embodiment.

FIG. 4 is a cross-sectional view illustrating a light emitting device package according to a fourth embodiment. According to the fourth embodiment, a phosphor layer 243 can be formed on the light emitting device 230. The phosphor layer 243 can be formed by a conformal coating process.

Figure 5:
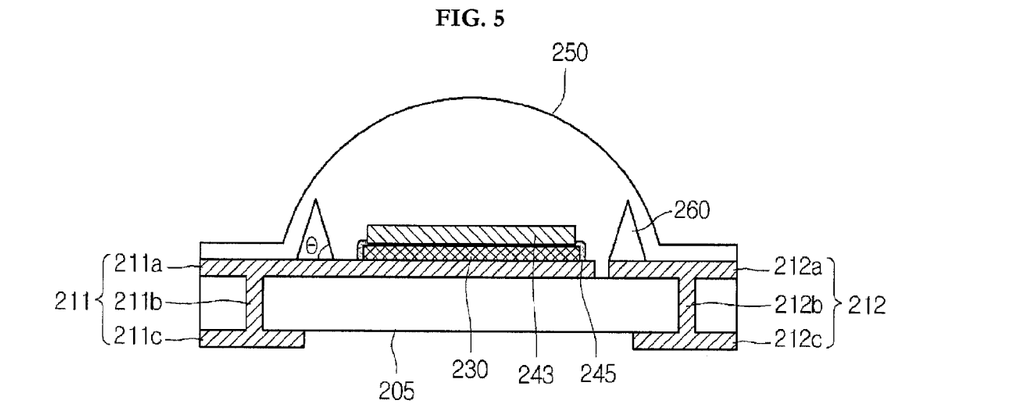
FIG. 5 is a cross-sectional view illustrating a light emitting device package according to a fifth embodiment.

FIG. 5 is a cross-sectional view illustrating a light emitting device package according to a fifth embodiment.

According to the fifth embodiment, a passivation 245 as a dielectric layer can be formed on a side surface of the light emitting device 230 to prevent an electric short.

The lens 250 may be formed of silicone in a dome shape, but is not limited thereto.

Figure 6:
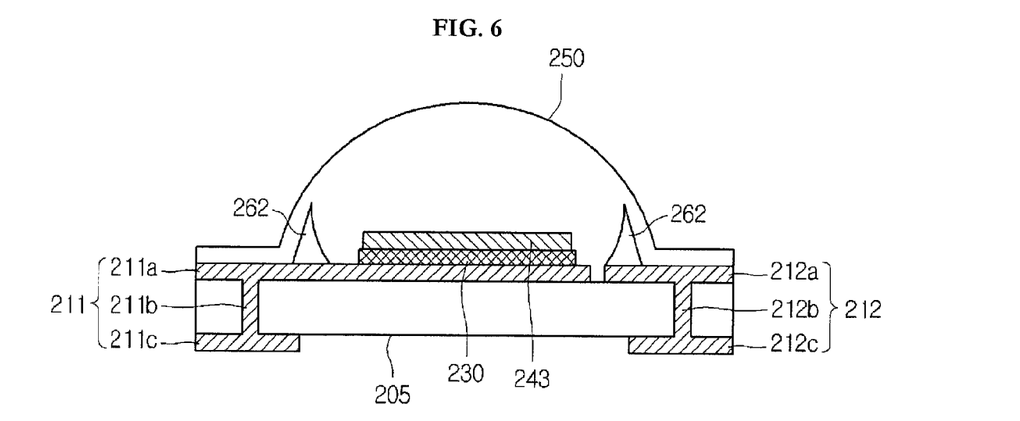
FIG. 6 is a cross-sectional view illustrating a light emitting device package according to a sixth embodiment.

FIG. 6 is a cross-sectional view illustrating a light emitting device package according to a sixth embodiment.

The sixth embodiment may use the technical features of the above embodiments.

A reflective structure 262 according to the sixth embodiment may have a side surface having a curvature and facing the light emitting device 230. Accordingly, the reflective structure 262 may vertically reflect light. For example, the reflective structure 262 may have a certain curvature to be convex or concave toward the light emitting device 230, but is not limited thereto. Referring to FIG. 6, the reflective structure 262 may have an inner surface having a curvature to be concave, but is not limited thereto.

Figure 7:
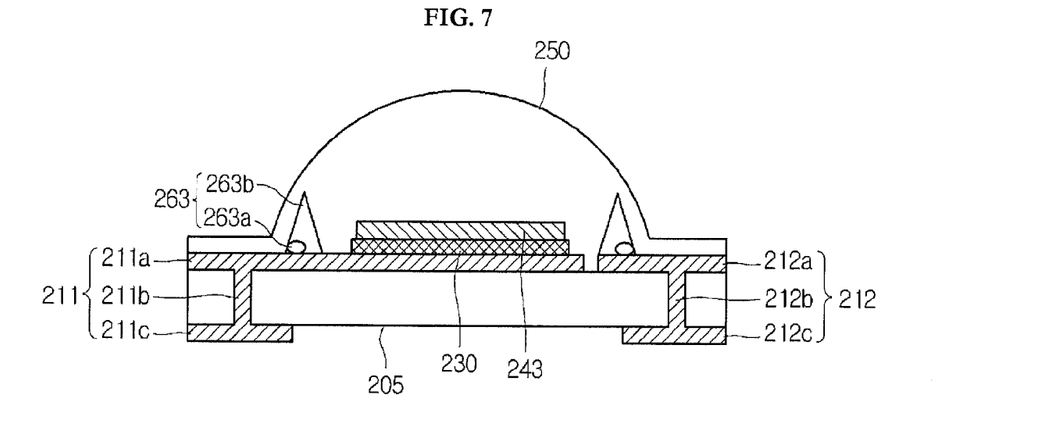
FIG. 7 is a cross-sectional view illustrating a light emitting device package according to a seventh embodiment.

FIG. 7 is a cross-sectional view illustrating a light emitting device package according to a seventh embodiment.

The seventh embodiment may use the technical features of the above embodiments.

A reflective structure 263 according to the seventh embodiment may include a plurality of layers formed of different materials or the same material. In this case, neighboring ones of the layers may be different in an index of refraction, but is not limited thereto.

For example, the reflective structure 263 may include a first barrier 263a on the package body 205, and a dielectric reflective structure 263b on the first barrier 263a.

The first barrier 263a may be a silicone barrier, but is not limited thereto.

After the first barrier 263a is formed, the dielectric reflective structure 263b is formed to increase a contact area between the dielectric reflective structure 263b and the first barrier 263a, thereby increasing contact force of the dielectric reflective structure 263b.

In addition, when the dielectric reflective structure 263b is formed after the first barrier 263a can be formed, the dielectric reflective structure 263b can have an inclined inner surface near the light emitting device 230, thereby improving vertical light extraction efficiency.

The first barrier 263a may be formed through a silicon dispensing process, but the forming of the first barrier 263a is not limited thereto. For example, the first barrier 263a may be formed by attaching a prefabricated silicone ring.

Figure 8:
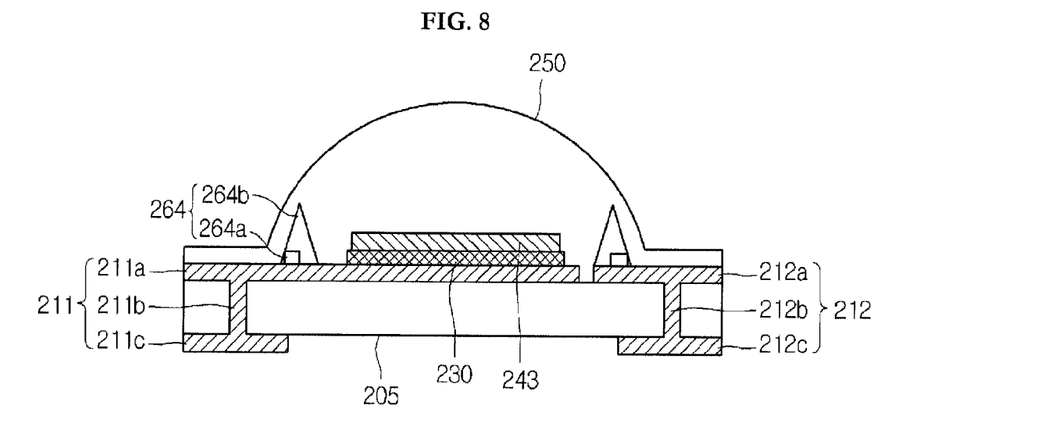
FIG. 8 is a cross-sectional view illustrating a light emitting device package according to an eighth embodiment.

FIG. 8 is a cross-sectional view illustrating a light emitting device package according to a eight embodiment.

The eighth embodiment may use the technical features of the above embodiments.

A reflective structure 264 according to the current embodiment may include a second barrier 264a on the package body 205, and a dielectric reflective structure 264b on the second barrier 264a.

The second barrier 264a may be a ceramic barrier, but is not limited thereto. The second barrier 264a may be formed by attaching a prefabricated ceramic ring, but the forming of the second barrier 264a is not limited thereto.

After the second barrier 264a is formed, the dielectric reflective structure 264b is formed to increase a contact area between the dielectric reflective structure 264b and the second barrier 264a, thereby increasing contact force of the dielectric reflective structure 264b.

In addition, when the dielectric reflective structure 264b is formed after the second barrier 264a is formed, the dielectric reflective structure 264b has an inclined inner surface near the light emitting device 230, thereby improving vertical light extraction efficiency.

Figure 9:
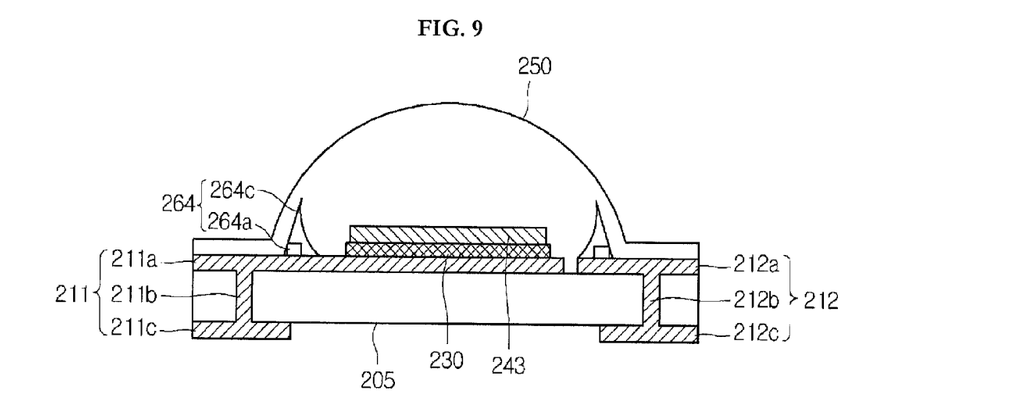
FIG. 9 is a cross-sectional view illustrating a light emitting device package according to a ninth embodiment.

FIG. 9 is a cross-sectional view illustrating a light emitting device package according to a ninth embodiment.

The ninth embodiment may use the technical features of the above embodiments.

Inner and outer portions of a dielectric reflective structure 264c according to the current embodiment may have different angle of inclinations. For example, when the dielectric reflective structure 264c is formed after the second barrier 264a is formed, the dielectric reflective structure 264c has an inclined inner surface near the light emitting device 230, and the inclined inner surface may have an angle of inclination smaller than that of an outer inclined surface of the dielectric reflective structure 264c, thereby improving light extraction efficiency.

According to the ninth embodiment, a light emitting device package may have improved light extraction efficiency, and a lighting system may include the light emitting device package.

Hereinafter, a method of fabricating a light emitting device package according to an embodiment will be described with reference to FIGS. 10 to 14

Figure 10:
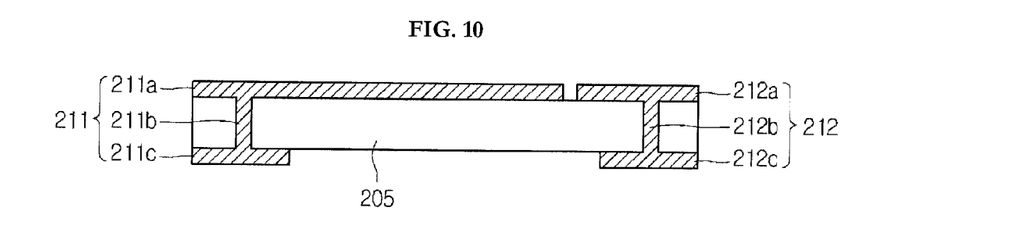
FIGS. 10 to 14 are cross-sectional views illustrating a method of fabricating a light emitting device package according to an embodiment.

Referring to FIG. 10, the package body 205 can be prepared, and the electrodes 211 and 212 are formed on the package body 205.

The package body 205 may include a ceramic dielectric layer. For example, the package body 205 may be formed of a low temperature co-fired ceramic (LTCC) or high temperature co-fired ceramic (HTCC), which is obtained by co-firing ceramic dielectric layers (not shown). Accordingly, metal electrode patterns according to a design may be formed between the ceramic dielectric layers.

A ceramic insulation layer constituting the package body 205 may be formed of a nitride or oxide. For example, the package body 205 may be formed of Si02, $Si_xO_y$, $Si_3N_4$, $Si_xN_y$, $SiO_xN_y$, $Al_2O_3$, or AlN, but is not limited thereto.

The electrodes 211 and 212 may include first and second electrodes (also denoted by 211 and 212) on the package body 205. The first electrode 211 and the second electrode 212 are electrically separated from each other as positive and negative electrodes in order to supply power to the light emitting device 230. Other electrodes than the first electrode 211 and the second electrode 212 may be provided according to a design of the light emitting device 230, but the present disclosure is not limited thereto.

The first electrode 211 and the second electrode 212 may have a multi-layered structure. For example, the first electrode 211 and the second electrode 212 may be a Ti/Cu/Ni/Au layer formed by sequentially stacking titanium (Ti), copper (Cu), nickel (Ni), and gold (Au).

That is, the lowermost layer of the first electrode 211 and the second electrode 212 is formed of a material efficiently adhered to the package body 205, such as titanium (Ti), chrome (Cr), and tantalum (Ta); the uppermost layer of the first electrode 211 and the second electrode 212 is formed of a material having excellent electric conductivity, such as gold (Au) to which a wire is efficiently attached; and a diffusion barrier layer formed of platinum (Pt), nickel (Ni), or copper (Cu) may be disposed between the lowermost layer and the uppermost layer. However, the present disclosure is not limited thereto.

The first electrode 211 and the second electrode 212 are patterned and stacked together with the package body 205, and then, are fired together with the package body 205.

Accordingly, the first electrode 211 and the second electrode 212 may be disposed within the package body 205.

The first electrode 211 may include a first upper electrode 211a exposed at the upper side of the package body 205, a first middle electrode 211b connecting to the first upper electrode 211a and passing through the package body 205, and a first lower electrode 211c connecting to the first middle electrode 211b and disposed under the package body 205. Alternatively, the first middle electrode 211b may be connected to the first lower electrode 211c along a side surface of the package body 205, without passing through the package body 205.

The second electrode 212 may include a second upper electrode 212a exposed at the upper side of the package body 205, a second middle electrode 212b connecting to the second upper electrode 212a and passing through the package body 205 and a second lower electrode 212c connecting to the second middle electrode 212b and disposed under the package body 205.

The first upper electrode 211a exposed on the package body 205 may function as a mounting pad on which the light emitting device 230 is mounted.

The second electrode 212 may be electrically connected to the top surface of the light emitting device 230 through a wire 245.

A reflective layer (not shown) may be formed on the first and second electrodes 211 and 212 on the top surface of the package body 205.

Figure 11:
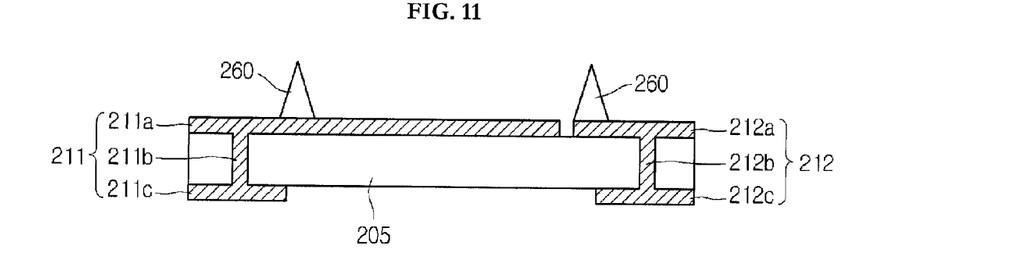

Next, referring to FIG. 11 the reflective structure 260 is formed on the package body 205.

The reflective structure 260 may be disposed around the light emitting device 230 on the package body 205 to control a vertical light emission distribution.

The reflective structure 260 may be formed of an insulating material having reflectivity. For example, the reflective structure 260 may include an oxide film formed of $TiO_2$ or $SiO_2$, but is not limited thereto. The reflective structure 260 may be formed using a mold, but is not limited thereto.

The angle of inclination of a side surface of the reflective structure 260 from a horizontal line may range from about 45° to about 90°, but is not limited thereto.

The reflective structure 260 may surround the light emitting device 230. For example, the reflective structure 260 may be provided in the form of a dam or ring to surround the light emitting device 230, but is not limited thereto.

The top surface of the reflective structure 260 may be higher than the top surface of the light emitting device 230, so that light emitted from the light emitting device 230 can be reflected upward at an orientation angle of about 120°, thereby controlling a vertical light emission distribution.

According to the sixth embodiment of FIG. 6, the side surface of the reflective structure 260 near the light emitting device 230 may have a curvature to vertically reflect light. For example, the reflective structure 260 may have a certain curvature to be concave toward the light emitting device 230, but is not limited thereto.

In addition, according to the seventh embodiment of FIG. 7, the reflective structure 263 may include the first barrier 263a on the package body 205, and the dielectric reflective structure 263b on the first barrier 263a. The first barrier 263a may be a silicone barrier, but is not limited thereto.

In addition, according to the eight embodiment of FIG. 8, the reflective structure 264 may include the second barrier 264a on the package body 205, and the dielectric reflective structure 264b on the second barrier 264a.

The second barrier 264a may be a ceramic barrier, but is not limited thereto. The second barrier 264a may be formed by attaching a prefabricated ceramic ring, but the forming of the second barrier 264a is not limited thereto.

Figure 12:
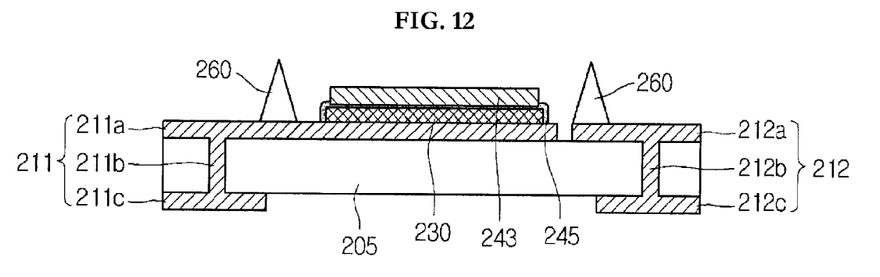

Next, referring to FIG. 12, the light emitting device 230 may be mounted on the package body 205.

The light emitting device 230 may be mounted directly on a dielectric layer of the package body 205, or be electrically connected to the first electrode 211 or the second electrode 212.

The light emitting device 230 may be mounted on and electrically connected to the first electrode 211, and be electrically connected to the second electrode 212 through the wire 245. For example, an end of the wire 245 may be bonded to the second electrode 212, and the other end thereof may be bonded to the light emitting device 230, but the present disclosure is not limited thereto.

The light emitting device 230 may be an ultraviolet light emitting diode having a wavelength ranging from about 245 nm to about 405 nm, a blue light emitting diode having a wavelength of visible light, or a red light emitting diode, but is not limited thereto.

The light emitting device 230 may be mounted using a wire bonding method, a die bonding method, or a flip bonding method, which may be selected according to the type of a chip and the position of an electrode of the chip.

The light emitting device 230 may include a group III-V compound semiconductor such as AlInGaN, InGaN, GaN, GaAs, InGaP, AlInGaP, InP, and InGaAs.

The light emitting device 230 may be adhered to the first electrode 211 through a conductive adhesive, and be electrically connected to the second electrode 212 through the wire 245. In this case, the light emitting device 230 may be called a vertical light emitting device.

Figure 13:
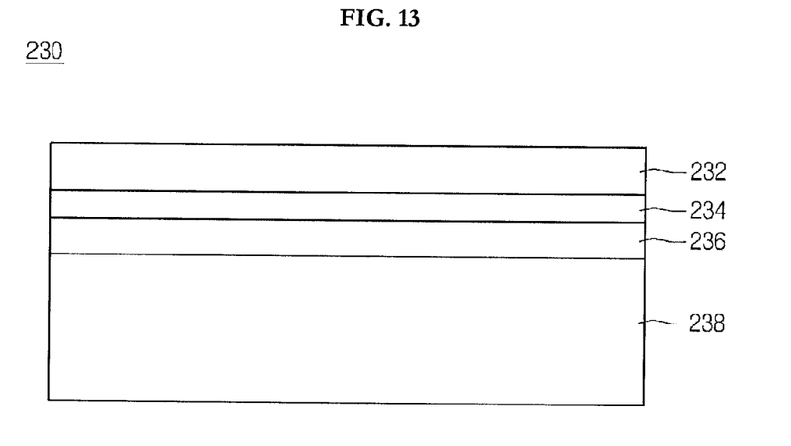

Referring to FIG. 13, the light emitting device 230 may include a second electrode layer 238, a second conductive type semiconductor layer 236, an active layer 234, and a first conductive type semiconductor layer 232, but is not limited thereto.

The second electrode layer 238 may include an ohmic layer (not shown), a reflective layer (not shown), a coupling layer (not shown), and a conductive substrate (not shown). The second electrode layer 238 may include at least one of titanium (Ti), chrome (Cr), nickel (Ni), aluminum (Al), platinum (Pt), gold (Au), tungsten (W), molybdenum (Mo), and a semiconductor substrate to which impurities are injected.

The first conductive type semiconductor layer 232 may be formed of a semiconductor compound. For example, the first conductive type semiconductor layer 232 may be formed of a group III-V semiconductor compound or a group II-VI semiconductor compound, and be doped with a first conductive type dopant. When the first conductive type semiconductor layer 232 is an n-type semiconductor layer, the first conductive type dopant as an n-type dopant may include Si, Ge, Sn, Se, or Te, but is not limited thereto. The first conductive type semiconductor layer 232 may include at least one of GaN, InN, AlN, InGaN, AlGaN, InAlGaN, AlInN, AlGaAs, InGaAs, AlInGaAs, GaP, AlGaP, InGaP, AlInGaP, and InP.

The active layer 234 may have at least one of a single quantum well structure or a multi quantum well (MQW) structure, a quantum wire structure, and a quantum dot structure. Well layer/barrier layer of the active layer 234 may have a pair structure with at least one of InGaN/GaN, InGaN/InGaN, GaN/AlGaN, InAlGaN/GaN, GaAs(InGaAs)/AlGaAs, and GaP(InGaP)/AlGaP, but are not limited thereto. The well layer may be formed of a material having a lower band gap than that of the barrier layer.

The second conductive type semiconductor layer 236 may be formed of a semiconductor compound. For example, the second conductive type semiconductor layer 236 may be formed of a group III-V semiconductor compound or a group II-VI semiconductor compound, and be doped with a second conductive type dopant. For example, the second conductive type semiconductor layer 236 may include a semiconductor having a compositional formula of $In_xAl_yGa_{1-x-y}N$ ($0 \leq x \leq 1$, $0 \leq y \leq 1$, and $0 \leq x+y \leq 1$). When the second conductive type semiconductor layer 236 is a p-type semiconductor layer, the second conductive type dopant may include Mg, Zn, Ca, Sr, or Ba as a P type dopant.

In the embodiment, the first conductive type semiconductor layer 232 may be an n-type semiconductor layer, and the second conductive type semiconductor layer 236 may be a p-type semiconductor layer, but the present disclosure is not limited thereto. A layer formed of a semiconductor having a pole opposite to that of a second conductive type semiconductor, e.g., an n-type semiconductor layer (not shown) may be formed on the second conductive type semiconductor layer 236. Accordingly, a light emitting structure having one of an n-p junction structure, a p-n junction structure, an n-p-n junction structure, and a p-n-p junction structure may be formed.

Next, referring to FIG. 12, the phosphor layer 243 may be formed on the light emitting device 230. Also, a resin layer 280 (see FIG. 3) can be formed on the light emitting device 230. For example, the resin layer 280 may have a dome shape through a dotting process.

The second electrode 212 may be electrically connected to the light emitting device 230 through a wire 290 (see FIG. 1).

The passivation 245 as a dielectric layer is formed on a side surface of the light emitting device 230 to prevent an electric short circuit.

Figure 14:
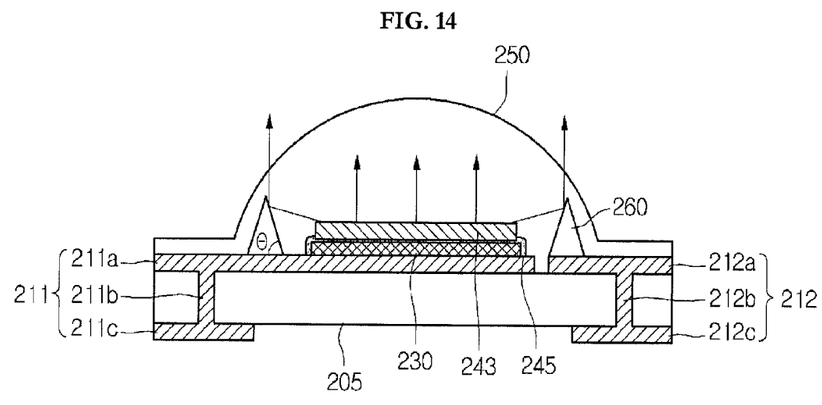

Next, referring to FIG. 14, a lens 250 may be formed on the phosphor layer 243.

The lens 250 may be formed of silicone in a dome shape, but is not limited thereto. The lens 250 may have physical properties similar to those of the phosphor layer 243, thereby minimizing thermal expansion stress due to thermal stress. For example, the lens 250 may be formed of silicone, but is not limited thereto.

According to the embodiment, a light emitting device package may have improved light extraction efficiency, and a lighting system may include the light emitting device package.

The light emitting device package may be provided in plurality on a substrate, and a light guide plate, a prism sheet, a spread sheet, and a fluorescent sheet may be disposed as optical members in the path of light emitted from the light emitting device package. The light emitting device package, the substrate, and the optical members may function as a lighting system such as a backlight unit, a lighting unit, an indicating device, a lamp, and a road lamp.

Figure 15:
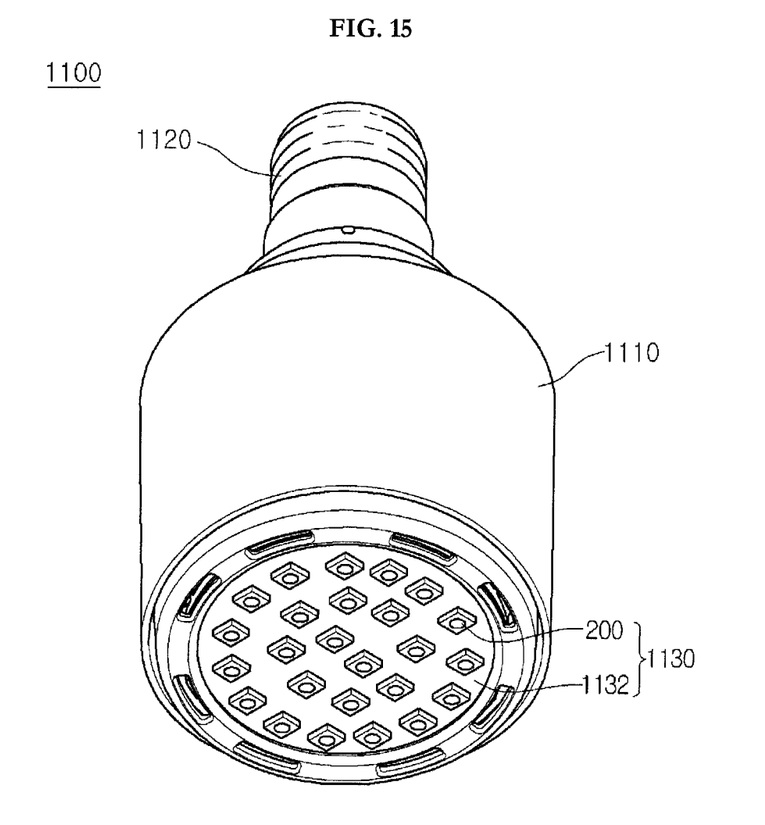
FIG. 15 is a perspective view illustrating a lighting unit according to an embodiment.

FIG. 15 is a perspective view illustrating a lighting unit 1100 according to an embodiment.

However, the lighting unit 1100 illustrated in FIG. 15 is just an example of a lighting system, and thus, the present disclosure is not limited thereto.

The lighting unit 1100 may include a case body 1110, a light emitting module part 1130 disposed in the case body 1110, and a connecting terminal 1120 disposed in the case body 1110 to receive power from an external power source.

The case body 1110 may be formed of a material having excellent heat dissipation performance. For example, the case body 1110 may be formed of a metal or resin.

The light emitting module part 1130 may include a board 1132 and at least one light emitting device package 200 mounted on the board 1132.

A circuit pattern may be printed on an insulation material to form the board 1132. For example, the board 1132 may include a printed circuit board (PCB), a metal core PCB, a flexible PCB, or a ceramic PCB.

Also, the board 1132 may be formed of a material that can efficiently reflect light, or be coated with a colored material, e.g., a white or silver-colored material by which light is efficiently reflected.

At least one light emitting device package 200 may be mounted on the board 1132. Each light emitting device package 200 may include at least one light emitting diode (LED) 240. The light emitting diode 240 may include a colored light emitting diode that emits red, green, blue, or white light, and an ultraviolet (UV) light emitting diode that emits a UV ray.

The light emitting device package 200 may be exemplified as a light emitting device package, but the present disclosure is not limited thereto.

The light emitting module part 1130 may have various combinations of the light emitting device packages 200 to obtain intended color and brightness. For example, a combination of a white light emitting diode, a red light emitting diode, and a green light emitting diode may be used to have a high color rendering index (CRI).

The connecting terminal 1120 may be electrically connected to the light emitting module part 1130 to supply power thereto. The connecting terminal 1120 is screwed in the form of a socket into an external power source, but is not limited thereto. For example, the connecting terminal 1120 may be inserted in the form of a pin into an external power source, or be connected to an external power source through a wire.

According to the embodiment, a light emitting device package may have improved reliability, and a lighting system may include the light emitting device package.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
    a package body;
    a first electrode and a second electrode on the package body;
    a light emitting device on the package body;
    a reflective structure around the light emitting device on the package body; and
    a lens on the light emitting device, wherein the lens covers the reflective structure,
    wherein the first electrode comprises:
        an upper electrode disposed on the package body;
        wherein the upper electrode of the first electrode is disposed between the package body and the light emitting device, and the upper electrode is disposed between the reflective structure and the package body, and
        wherein the reflective structure is vertically overlapped with the package body and the upper electrode of the first electrode,
        wherein the reflective structure includes a bottom surface and an outside surface,
        wherein the lens includes a bottom surface and a top surface,
        wherein the bottom surface of the lens and the bottom surface of the reflective structure mechanically contact the at least one of the first electrode and the second electrode, and
        wherein the outside surface of the reflective structure is surrounded by the lens.

2. The light emitting device package according to claim 1, wherein the lens contacts the upper electrode of the first electrode,
    wherein the reflective structure contacts the upper electrode of the first electrode.

3. The light emitting device package according to claim 1, wherein the first electrode comprises:
    a middle electrode connecting to the upper electrode and passing through the package body; and
    a lower electrode connecting to the middle electrode and disposed under the package body,
    wherein the lens is vertically overlapped with the middle electrode.

4. The light emitting device package according to claim 1, further comprising a passivation is formed on a side surface of the light emitting device.

5. The light emitting device package according to claim 1, wherein the reflective structure has an inner surface with a concave curvature.

6. The light emitting device package according to claim 1, further comprising a phosphor layer on the light emitting device,
    wherein a top most surface of the phosphor layer is disposed below a top portion of the reflective structure,
    wherein the phosphor layer has a flat top surface.

7. The light emitting device package according to claim 1, wherein the package body has a flat upper surface and a flat bottom surface, and the upper electrode of the first electrode is disposed on the flat upper surface of the package body.

8. The light emitting device package according to claim 1, wherein the second electrode includes:
    an upper electrode disposed on the package body, a middle electrode connecting to the upper electrode and passing through the package body; and
    a lower electrode connecting to the middle electrode and disposed under the package body,
    wherein a length of the upper electrode of the first electrode is longer than a length of lower electrode of the first electrode.

9. The light emitting device package according to claim 1, wherein the reflective structure comprises a plurality of layers formed of different materials.

10. The light emitting device package according to claim 1, wherein the lens and the reflective structure are different in an index of refraction.

11. The light emitting device package according to claim 1, wherein the reflective structure has a cone type in a cross section view.

12. A light emitting device package comprising:
a package body;
a first electrode on the package body;
a light emitting device on the package body;
a reflective structure around the light emitting device on the package body; and
a lens on the light emitting device, wherein the lens covers the reflective structure,
wherein the reflective structure comprises:
a barrier on the package body; and
a dielectric reflective structure on the barrier;
wherein the first electrode comprises:
an upper electrode disposed on the package body;
wherein the reflective structure is vertically overlapped with the package body and the upper electrode of the first electrode,
wherein the barrier is disposed between the dielectric reflective structure and the first electrode, and the barrier is covered by the dielectric reflective structure.

13. The light emitting device package according to claim 12, wherein the first electrode comprises:
a middle electrode connecting to the upper electrode and passing through the package body; and
a lower electrode connecting to the middle electrode and disposed under the package body,
wherein the reflective structure directly contacts the upper electrode of the first electrode.

14. The light emitting device package according to claim 13, wherein inner and outer portions of the dielectric reflective structure have different angle of inclinations.

15. The light emitting device package according to claim 12, wherein the barrier is a silicone barrier.

16. The light emitting device package according to claim 12, the barrier is a ceramic barrier.

17. The light emitting device package according to claim 13, wherein the upper electrode of the first electrode is disposed between the reflective structure and the package body.

18. A light emitting device package comprising:
a package body having an upper surface and a bottom surface;
a first electrode and a second electrode on the package body;
a light emitting device on the package body;
a reflective structure around the light emitting device on the package body;
a resin on the light emitting device; and
a lens on the resin,
wherein the first electrode comprises:
an upper electrode disposed on the upper surface of the package body;
wherein the second electrode comprises:
an upper electrode disposed on the upper surface of the package body;
wherein an area of the upper electrode of the first electrode is greater than an area of the upper electrode of the second electrode,
wherein the reflective structure includes a bottom surface and an outside surface,
wherein the lens includes a bottom surface and a top surface,
wherein the bottom surface of the reflective structure is disposed on a different part from a part of the upper surface of the package body on which the bottom surface of the lens is disposed, and
wherein the outside surface of the reflective structure is surrounded by the lens.

19. The light emitting device package according to claim 18, wherein the first electrode comprises:
a middle electrode connecting to the upper electrode and passing through the package body; and
a lower electrode connecting to the middle electrode and disposed on the bottom surface of the package body,
wherein the reflective structure is disposed on a part of the upper electrode of the electrode in the lens, and
wherein the second electrode comprises:
a lower electrode disposed on the bottom surface of the package body, and
a middle electrode disposed between the upper electrode and the lower electrode of the second electrode,
wherein the reflective structure is vertically overlapped with the package body and the upper electrode of the first electrode,
wherein the reflective structure is vertically overlapped with the package body and the upper electrode of the first electrode,
wherein the reflective structure directly contacts the upper electrode of the first electrode.

20. The light emitting device package according to claim 18, wherein the upper surface of the package body has a flat surface parallel to the bottom surface of the package and at least a part of the upper surface of the first electrode is disposed between the reflective structure and the flat surface of the upper surface of the package body,
wherein the dielectric reflective structure includes $TiO_2$.

* * * * *